United States Patent
Khosrowpour et al.

[11] Patent Number: 5,831,351
[45] Date of Patent: Nov. 3, 1998

[54] METHOD AND APPARATUS FOR SELF SHUTDOWN OF A BATTERY-BACKED CIRCUIT CARD

[75] Inventors: Farzad Khosrowpour, Austin; Alan E. Brown, Georgetown, both of Tex.

[73] Assignee: Dell USA L.P., Austin, Tex.

[21] Appl. No.: 489,261

[22] Filed: Jun. 9, 1995

[51] Int. Cl.⁶ ...................................................... H01H 3/00
[52] U.S. Cl. .......................... 307/139; 307/112; 307/150; 365/226; 395/280
[58] Field of Search ................................ 307/64, 66, 112, 307/116, 125, 139, 140, 150; 365/226, 227, 228, 229; 395/280, 281, 282, 283; 439/955, 64, 188, 489

[56] References Cited

U.S. PATENT DOCUMENTS

| | | | |
|---|---|---|---|
| 4,441,031 | 4/1984 | Moriya et al. | 307/66 |
| 4,449,206 | 5/1984 | Tokitsu et al. | 365/229 |
| 4,675,538 | 6/1987 | Epstein | 307/64 |
| 5,317,697 | 5/1994 | Husak et al. | 395/283 |
| 5,321,663 | 6/1994 | Nishi | 365/229 |
| 5,432,916 | 7/1995 | Hahn et al. | 395/283 |
| 5,438,549 | 8/1995 | Levy | 365/229 |
| 5,463,261 | 10/1995 | Skarda et al. | 307/131 |
| 5,568,610 | 10/1996 | Brown | 395/185.01 |
| 5,589,719 | 12/1996 | Fiset | 307/131 |

*Primary Examiner*—Jeffrey A. Gaffin
*Assistant Examiner*—Jonathan S. Kaplan
*Attorney, Agent, or Firm*—Akin, Gump, Strauss, Hauer & Feld, L.L.P.

[57] ABSTRACT

A self-shutdown system for a circuit card when removed from the connector of a primary system, where the circuit card includes a local power source for providing power when primary power is not available. A dedicated sense pin on the connector of the card is grounded to the remaining ground pins when the card is plugged in but floats or is otherwise disconnected when the card is unplugged from the primary system. A ground switch circuit connected to the sense pin and the remaining ground pins asserts a shutdown signal for disabling the circuitry on the card when the ground sense pin is floating or deasserts the shutdown signal when the ground sense pin is grounded. In one embodiment, the disable mechanism is a switch circuit for disconnecting the main circuitry of the card from the local power source. In the preferred embodiment, however, a DC/DC converter receives the shutdown signal and disables the remaining circuitry when the shutdown signal is asserted. In this manner, the main circuitry of the card is disabled and thereby protected in the event the unplugged card comes in contact with conductive surfaces which might otherwise damage the enabled card. A manual override switch or jumper can be used to disable the automatic shutdown system.

20 Claims, 2 Drawing Sheets

5,831,351

METHOD AND APPARATUS FOR SELF SHUTDOWN OF A BATTERY-BACKED CIRCUIT CARD

FIELD OF THE INVENTION

The present invention relates to battery-backed circuit cards, and more particularly to automatically shutting down a battery-backed daughter board or expansion card when unplugged from the computer system.

DESCRIPTION OF THE RELATED ART

Many daughter boards and expansion cards for a personal computer (PC) system, such as the IBM PC AT or the like, have a battery backup function for minimum operation when system power is not available. This is common in server PCs where it is desired to maintain certain functionality in case the computer fails or is otherwise powered down. For example, a server management card, such as the Hobbes card by the Intel Corporation, provides a battery backup feature which allows the card to operate even when the primary or main computer system power is removed.

It is noted that such battery backed cards continue operation even when unplugged from the PC system, which is not desired in most cases. Mishandling of the card, such as placing it in contact with conductive elements or surfaces, may cause electrical short circuits thereby causing malfunction or damage to the card. Therefore, it is not desired to have the card continue to function when unplugged from the PC. It is desired to provide an automatic shutdown method for sensing the removal of the card from the backplane to achieve the desired circuit protection.

SUMMARY OF THE INVENTION

Self shutdown of battery-backed daughter boards or expansion cards according to the present invention uses a ground sense switch to detect the card being removed and to correspondingly disconnect the card circuitry from a local power source while the card is unplugged. The local power source is typically a backup battery. The ground sense is facilitated through the use of a dedicated sense pin on the connector of the card, which is grounded to chassis ground and thus connected to the local ground of the card when plugged into the electronic device or PC. A disable circuit located on the card and biased with the local power source detects when the sense pin is connected to chassis ground and correspondingly enables the circuitry on the card. When the card is unplugged, the sense pin is electrically disconnected or floated so that the disable circuit disables the card circuitry by disconnecting it from the battery. In this manner, the card remains electrically disabled while it is unplugged, thereby preventing harm if accidentally exposed to conductive elements or surfaces.

In one embodiment, a ground sense circuit is coupled through a local backup battery and to the sense pin and controls a switch. The switch switches power between the local power source and the primary circuitry of the card. In this manner, when the card is unplugged, the sense pin electrically floats and the ground sense circuit disconnects the primary circuitry from ground, thereby shutting down the card. When the card is plugged in, the sense pin is connected to ground and the ground sense circuit connects the primary circuitry to allow normal operation.

In another embodiment, the card includes a power supply controller, such as the MAX786 by Maxim Integrated Products, which includes a shutdown input and which maintains its logic supply voltage even when in the shutdown state. The controller is preferably a DC/DC converter receiving the battery voltage for supplying a regulated output supply voltage. The ground sense switch is preferably implemented with a field-effect transistor (FET) biased by the supply voltage and coupled to the sense pin. The FET asserts the shutdown input of the controller when the card is unplugged, and deasserts the shutdown input when the card is plugged in. The ground sense switch may also be implemented using Schmitt trigger inverter or the like.

Thus, a self-shutdown method and apparatus according to the present invention disables a circuit card when removed from the PC to prevent harm to the primary card circuitry due to accidental contact with conductive elements. The card is otherwise unaffected when plugged into the PC.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
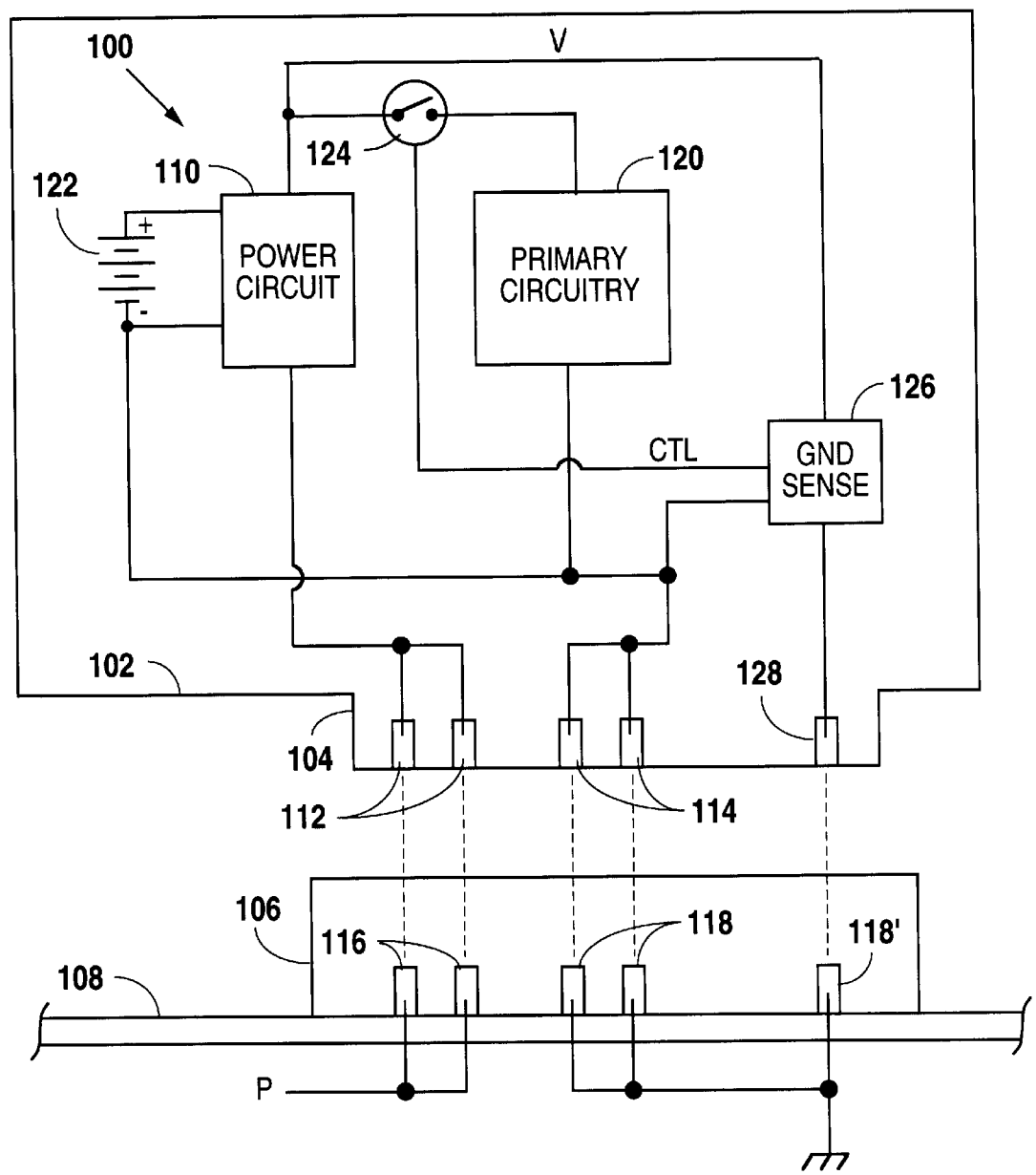
FIG. 1 is a block diagram of a circuit card according to the present invention for plugging into a planar of a PC.

Referring now to FIG. 1, a block diagram is shown of a self-shutdown circuit 100 according to the present invention. In particular, a daughter board or expansion card, generally referred to as the circuit card 102, includes a connector 104 for interfacing a connector 106 mounted to a planar 108 of a computer system or electronic device. The circuit card 102 mainly comprises a printed circuit board (PCB) for mounting components and routing electrical signals. The connector 104 may be either an input/output (I/O) edge connector, such as for an expansion card, or may be a surface mounted connector, such as typically found for plug-in daughter boards. The present invention is not limited to any particular type of card or board or to any particular type of connector.

A power circuit 110 provided on the circuit card 102 typically regulates a power signal V for supplying power to primary circuitry 120 located on the circuit card 102. The power circuit 110 is connected to one or more power pins 112 and also to one or more ground pins 114 along the connector 104 for receiving power from the planar 108 through a plurality of power pins 116 and ground pins 118 on the connector 106. The primary circuitry 120 is also grounded through the ground pins 114. If the power signals are not provided by the planar 108, a backup battery 122 provides power to the power circuit 110 for the primary circuitry 120. The battery 122 may be connected in one of several different ways, but generally has its positive and negative terminals connected to the power circuit 110 and its negative terminal further connected to the ground pins 114. In this manner, the power circuit 110 provides power through the V signal from the planar 108 if available, or from the battery 122 when the planar 108 is powered down or otherwise fails to supply power.

The circuit card 102 also includes a controlled switch 124, such as a relay, transistor switch or the like, which is located either external from or internal to the power circuit 110. The switch 124 has two terminals connected between a conductor carrying the V signal and the primary circuitry 120. The switch 124 is controlled through a control signal CTL by a ground sense circuit 126, which is connected to the ground pins 114 and the V signal. The ground sense circuit 126 asserts the CTL signal to close switch 124 to allow the power circuit 110 and/or the battery 122 to provide power to the primary circuitry 120. The ground sense circuit 126 is further connected to a dedicated sense pin 128 along the connector 104 of the circuit card 102, which electrically connects to a corresponding ground pin 118' connected to the ground pins 118 of the connector 106 when the circuit card 102 is plugged into the connector 106.

The ground sense circuit 126 operates to assert the CTL signal when the connector 104 is plugged into the connector 106 so that the dedicated sense pin 128 is connected to chassis ground of the planar 108, thereby closing switch 124. Since the ground pin 118' is connected to the ground pins 118, the ground sense circuit 126 detects the sense pin 128 connected to the ground pins 114 of the circuit card 102.

In this manner, the power circuit 110 provides power to the primary circuitry 120 either from the planar 108 or from the backup battery 122 as desired. However, if the circuit card 102 is unplugged from the connector 106, the dedicated sense pin 128 is left floating since not connected to the ground pins 114, so that the ground sense circuit 126 deasserts the CTL signal, thereby opening switch 124. The primary circuitry 120 is thereby disabled and thus is protected from accidental contact while the circuit card 102 is unplugged. In this manner, it is appreciated that the self-shutdown circuitry 100 according to the present invention disables the circuit card 102 when unplugged from the planar 108 to prevent accidental electrical shorts which could otherwise harm the primary circuitry 120. However, when the circuit card 102 is plugged into the connector 106, the sense pin 128 is connected to chassis ground to enable the primary circuitry 120 to operate normally.

Many variations of the self-shutdown circuit 100 are possible and contemplated. For example, the V signal may comprise two separate signals including a regular power signal and a low power signal for sensing purposes. The embodiments described below illustrate this variation. The switch 124 could be controlled by a separate signal from the power circuit 110, where the CTL signal from the ground sense circuit 126 is provided to the power circuit 110. Of course, the power circuit 110 would include circuitry for relaying the sensing CTL signal. Also, the switch 124 could connect/disconnect ground rather than the V signal to enable/disable, respectively, the primary circuitry 120.

Figure 2:
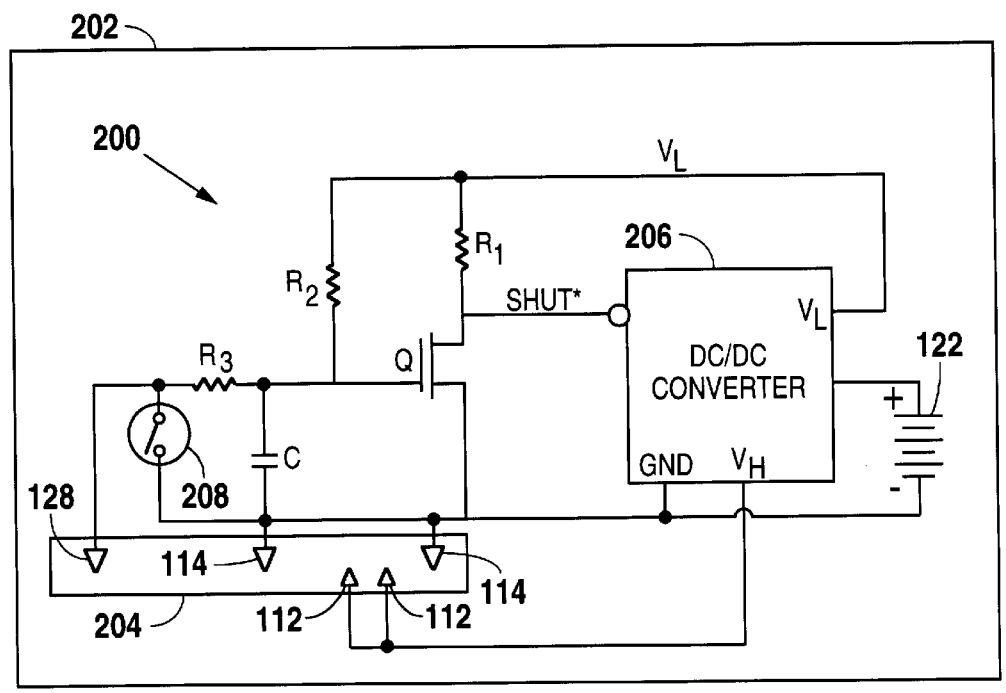
FIG. 2 is a more detailed schematic diagram of another embodiment according to the present invention.

Referring now to FIG. 2, a more detailed schematic diagram is shown of a self-shutdown system 200 according to the present invention. The system 200 is preferably implemented on an expansion card and/or daughter board 202 in a similar manner as the self-shutdown system 100, where the system 200 includes a connector 204 for mounting to a corresponding connector (not shown) of a PC or other electronic device. The connector 204 also includes power pins 112, ground pins 114 and a dedicated sense pin 128 in a similar manner as the connector 104 shown in FIG. 1. In the preferred embodiment, the circuit card 202 includes a DC/DC converter 206, which is preferably the MAX786 by Maxim Integrated Products (MAX), which is a dual output power supply controller for notebook computers. The DC/DC converter 206 is preferably coupled to the ground pins 114, the power pins 112, and also to the backup battery 122 provided on the circuit card 202. The DC/DC converter 206 provides a logic supply voltage $V_L$ and an inverted shutdown input for shutting down the power supply of the circuit card 202. The inverted shutdown input receives a signal SHUT*, which enables the DC/DC converter 206 when deasserted high, but otherwise disables the DC/DC converter 206 when asserted low. An asterisk (*) at the end of a signal name denotes negative logic where the signal is considered asserted when low and deasserted when high.

The $V_L$ signal is connected to one end of each of two resistors R1, R2 where the other side of the resistor R1 is connected to the SHUT* signal and to the drain of a field-effect transistor (FET) Q. The source of the FET Q is connected to the ground pins 114 and its gate is connected to the other end of the resistor R2, to one end of a resistor R3 and to one end of a capacitor C. The other end of the capacitor C is connected to the ground pins 114, and the other end of the resistor R3 is connected to the dedicated sense pin 128 of the connector 204 and to one contact of a single-pole, single-throw manual switch 208. The other contact of the switch 208 is connected to the ground pins 114.

Operation of the automatic shutdown system 200 is now described. The switch 208 is a manual override switch for overriding self-shutdown according to the present invention when closed. Thus, the following description assumes that the switch 208 is opened. The DC/DC converter 206 receives power through the connector 204 from the PC or electronic device when the circuit card 202 is plugged in. If power from the PC or electronic device fails or is otherwise removed, the DC/DC converter 206 provides power from the backup battery 122. While the circuit card 202 is plugged into the PC, the sense pin 128 is connected to ground through a corresponding ground pin on the PC connector, such as the ground pin 118' shown in FIG. 1. When the pin 128 is grounded, the resistors R2 and R3 bias the FET Q off, so that the SHUT* signal is pulled high through resistor R1 to the $V_L$ signal. In this manner, the DC/DC converter 206 is activated and operates in a normal fashion. The resistors R2, R3 preferably have values of 10KΩ each in the preferred embodiment, which is sufficient to shut off the FET Q when pin 128 is grounded.

If the card 208 is unplugged, the sense pin 128 is disconnected from pins 114 and thus electrically floats, so that the gate of FET Q is pulled high through resistor R2, pulling the SHUT* signal to the voltage level of the ground pins 114. This shuts down the DC/DC converter 206 and thus disables the card 208 from normal operation. In this manner, the primary circuitry (not shown) of the circuit card 202 remains protected, since not operating when it is unplugged from the PC or electronic device. It is noted that if it is desired to continue operation of circuit card 202 when it is unplugged, the switch 208 is switched to contact 208B to override self-shutdown so that the FET Q remains off and the DC/DC converter 206 remains enabled. Of course, override mechanisms other than switch 208 are contemplated, such as a jumper or the like. It is further noted that the resistor R3 and capacitor C provide a passive input filter to remove noise level down to approximately 7 kHz when the resistor R3 is 10KΩ and the capacitor is 0.01 microfarads ($\mu$F). More passive filtering can be applied if desired.

Figure 3:
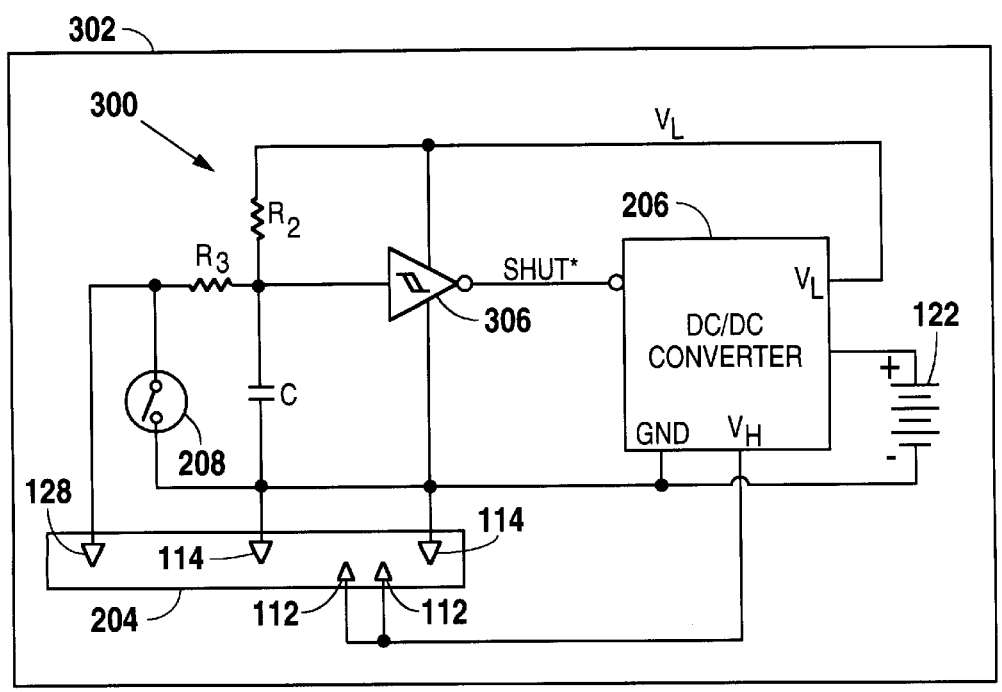
FIG. 3 is a schematic diagram of yet another embodiment according to the present invention.

Referring now to FIG. 3, an alternative card 302 incorporating another self-shutdown system 300 according to the present invention is shown. The self-shutdown system 300 is similar to the self-shutdown system 200, where similar components assume identical reference numbers. Again, the card 302 includes a connector 204 with power pins 112, ground pins 114 and the dedicated sense pin 128. The connector 204 is connected to the DC/DC converter 206, which is further connected to the backup battery 122 in a similar manner as described for FIG. 2. In this embodiment, however, the $V_L$ signal provides power to a Schmitt trigger inverter 306, such as the TC4S584F, manufactured by Toshiba. The inverter 306 is grounded through the ground pins 114 and asserts the SHUT* signal at its output to the shutdown input of the DC/DC converter 206. The input of the inverter 306 is connected to one end of a resistor R2, to one end of a resistor R3 and to one end of a capacitor C. The other end of the resistor R2 is connected to the $V_L$ signal, the other end of the resistor R3 is connected to one contact of the manual override switch 208 and to the sense pin 128. The other contact of the switch 128 and the other end of the capacitor C is connected to the ground pins 114. Again, the switch 208 serves as a manual override mechanism and is assumed closed. The resistor R2 in this case is preferably much larger with respect to resistor R3. The resistor R2 is preferably 100KΩ, while resistor R3 is 4KΩ, although other resistance values are contemplated. Again, the capacitor C is preferably 0.01 $\mu$F, although different values are contemplated depending upon the level of passive filtering required.

Operation of the self-shutdown system 300 is similar to the self-shutdown system 200. The switch 208 operates in the same manner as a manual override. When the card 302 is plugged into a connector grounding the sense pin 128, the input of the inverter 306 is pulled low through voltage divider R2, R3, so that the inverter 306 asserts its output high to enable the DC/DC converter 206. This allows the card 302 to operate in a normal fashion. However, when the card 302 is unplugged from the system, the sense pin 128 electrically floats so that the input of inverter 306 is pulled high through resistor R2. The inverter 306 respondingly asserts its output low, thereby disabling or otherwise shutting down the DC/DC converter 206. This protects the primary circuitry (not shown) provided on the card 302, since it does not receive power when the card 302 is unplugged from the main system. The $V_L$ signal remains asserted by the DC/DC converter 206 even though shut down as described previously, so that when the card 302 is subsequently plugged back into the system, the input of inverter 306 is pulled low, so that it deasserts the SHUT* signal and enables the DC/DC converter 206 to allow normal operation.

It is noted that the $V_L$ signal of both automatic shutdown systems 200, 300 remains activated even when the DC/DC converter 206 is shut down. This is a characteristic of the DC/DC converter 206. However, other DC/DC converters not providing this function could be used where the positive terminal of the battery 122 is used to bias the FET Q or the inverter 306 rather than a signal such as $V_L$. Thus, the present invention is not limited to any particular type of DC/DC converter.

It is now appreciated that a self-shutdown system according to the present invention incorporated on a battery-backed daughter board or expansion card protects the circuitry on the card when unplugged from the main system. A dedicated sense pin on the circuit card serves to detect connection to ground of the main system. In the preferred embodiment, the sense pin is connected to a ground sense switch, biased by the backup battery or local power converter, which correspondingly enables or disables the battery or circuitry on the circuit card depending upon whether the sense pin is grounded or floating, respectively. In this manner, the circuitry on the card remains powered off when the circuit card is disconnected, thereby protecting the circuitry from accidental electrical shorts.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A self-shutdown system for a removable circuit card for disabling the card when removed from a corresponding system connector of an electronic system, the circuit card including a power source for providing power to circuitry on the card and the system connector including at least one grounded pin, the self-shutdown system comprising:

a card connector for plugging into said system connector having a sense pin for electrically shorting to the grounded pin of the system connector, wherein said sense pin electrically floats when said card connector is unplugged from the system connector; and a disable circuit coupled to said sense pin of said card connector for sensing said sense pin electrically floating and correspondingly disconnecting the power source from the circuitry of the circuit card.

2. The self-shutdown system of claim 1, wherein said power source includes a backup battery.

3. The self-shutdown system of claim 1, wherein said disable circuit comprises:

a sensing circuit coupled to said sense pin for asserting a shutdown signal when said sense pin is floating; and a switch receiving said shutdown signal for disconnecting the card circuitry from the power source.

4. The self-shutdown system of claim 3, wherein said switch disconnects a power signal provided by the power source from the card circuitry.

5. The shutdown system of claim 1, wherein said disable circuit comprises:

a transistor circuit having a current path coupled between the power source and a ground pin of said card connector and a control terminal coupled to said sense pin.

6. The self-shutdown system of claim 5, wherein said transistor is a field-effect transistor.

7. The self-shutdown system of claim 1, wherein said disable circuit includes an inverter for asserting a shutdown signal when said sense pin is floating and for deasserting said shutdown signal when said sense pin is grounded.

8. The self-shutdown system of claim 7, wherein said inverter is a Schmitt trigger inverter.

9. The self-shutdown system of claim 1, wherein said disable circuit comprises:

a switch circuit coupled to said sense pin and said ground pin of said card connector for sensing said sense pin floating and for correspondingly asserting a shutdown signal; and a converter for coupling to the power source for providing power to card circuitry, said converter including a shutdown input for receiving said shutdown signal and for correspondingly disconnecting the card circuitry from the power source.

10. The self-shutdown system of claim 9, wherein said switch circuit comprises:

an inverter having an input coupled to said sense pin and an output for asserting said shutdown signal.

11. The self-shutdown system of claim 10, further comprising:

a pull-up resistor coupled between said inverter input and said converter.

12. The self-shutdown system of claim 9, wherein the power source is a battery and wherein said converter is a DC/DC converter.

13. A circuit card for inserting into an I/O slot of a computer system having at least one ground connection, comprising:

a power source;

a card connector for interfacing the I/O slot having a sense pin which is grounded via the ground connection when said card connector is inserted into the I/O slot and which is electrically floated when said card connector is removed; and a disable circuit coupled to said power source and said sense pin for disconnecting said power source when said sense pin is floated.

14. The circuit card of claim 13, wherein said power source includes a battery.

15. The circuit card of claim 14, wherein said power source comprises a DC/DC power converter coupled to said battery, said DC/DC converter deriving power from the computer system through said card connector but otherwise deriving power from said battery.

16. The circuit card of claim 15, wherein said DC/DC converter includes a shutdown input for disconnecting power on the I/O card, wherein said disable circuit comprises:

a switch circuit coupled to said sense pin for asserting a shutdown signal to said shutdown input of said DC/DC converter when said sense pin is floated.

17. The circuit card of claim 16, wherein said switch circuit includes a transistor.

18. The circuit card of claim 16, wherein said switch circuit includes a Schmitt trigger inverter.

19. The circuit card of claim 13, wherein said disable circuit disconnects circuitry on the I/O card from said power source.

20. A method for shutting down a removable circuit card when unplugged from a connector of a computer system having at least one ground connection, the circuit card having a local power source, comprising the steps of:

determining whether a sense pin provided on the connector of the circuit card is grounded to the computer system or floating;

enabling the circuit card by connecting the local power source when the sense pin is grounded; and disabling the circuit card by disconnecting the local power source when the sense pin is floating.

* * * * *